(12) United States Patent
Akimoto et al.

(10) Patent No.: US 7,793,609 B2
(45) Date of Patent: Sep. 14, 2010

(54) COATING AND DEVELOPING APPARATUS

(75) Inventors: Masami Akimoto, Koshi (JP); Shinichi Hayashi, Koshi (JP); Yasushi Hayashida, Koshi (JP); Nobuaki Matsuoka, Koshi (JP); Yoshio Kimura, Koshi (JP); Issei Ueda, Koshi (JP); Hikaru Ito, Minato-ku (JP)

(73) Assignee: Tokyo Electron Limited, Tokyo-To (JP)

( * ) Notice: Subject to any disclaimer, the term of this patent is extended or adjusted under 35 U.S.C. 154(b) by 1143 days.

(21) Appl. No.: 11/342,616

(22) Filed: Jan. 31, 2006

(65) Prior Publication Data
US 2007/0056514 A1 Mar. 15, 2007

(30) Foreign Application Priority Data
Feb. 1, 2005 (JP) ............................. 2005-025509

(51) Int. Cl.
*B05C 5/02* (2006.01)
(52) U.S. Cl. ............................. 118/52; 118/56; 118/319; 118/320; 396/611
(58) Field of Classification Search ................... 118/52, 118/56, 319, 320; 396/611; 414/935–937
See application file for complete search history.

(56) References Cited

U.S. PATENT DOCUMENTS 6,264,381 B1 * 7/2001 Ueda ........................... 396/604
6,402,400 B1 * 6/2002 Ueda et al. ................... 396/611
6,471,422 B1 * 10/2002 Ueda et al. ................... 396/611

FOREIGN PATENT DOCUMENTS

| JP | 2001-176792 | 6/2001 |
| JP | 2004-193597 | 7/2004 |

* cited by examiner

*Primary Examiner*—Laura Edwards
(74) *Attorney, Agent, or Firm*—Oblon, Spivak, McClelland, Maier & Neustadt, L.L.P.

(57) ABSTRACT

Provided is a coating and developing apparatus composed of an assembly of plural unit blocks. A first unit-block stack and a second unit-block stack are arranged at different positions with respect to front-and-rear direction. Unit blocks for development, each of which comprises plural processing units including a developing unit that performs developing process after exposure and a transfer device that transfers a substrate among the processing units, are arranged at the lowermost level. Unit blocks for application, or coating, each of which comprises plural processing units including a coating unit that performs application process before exposure and a transfer device that transfers a substrate among the processing units, are arranged above the unit blocks for development. Unit blocks for application are arranged in both the first and second unit-block stacks. Unit blocks for application which a wafer goes through are determined depending on the layering positional relationship between an antireflective film and a resist film. An exposed wafer goes only through the unit block for development without going through any one of the unit blocks for application.

6 Claims, 11 Drawing Sheets

COATING AND DEVELOPING APPARATUS

TECHNICAL FIELD

The present invention relates to a coating and developing apparatus that performs a resist liquid coating process and a developing process after exposure to a substrate such as a semiconductor wafer or an LCD substrate (a glass substrate for a liquid crystal display).

BACKGROUND ART

In fabricating a semiconductor device or a LCD substrate, a resist pattern is formed on a substrate with the use of photolithography technique. In order to form a resist pattern on a semiconductor wafer (hereinafter referred simply to "wafer"), the wafer is coated with a resist liquid to form a resist film on the wafer, the resist film is exposed with the use of photomask, and then the resist film is subjected to a developing process. In general, the resist pattern formation is carried out by a resist pattern forming system composed of a coating and developing apparatus that coats and develops a resist and an exposure apparatus connected to the coating and developing apparatus.

JP2004-193597A discloses a coating and developing apparatus, which is schematically shown in FIG. 11. A carrier 10 holding therein plural wafers W is carried into a carrier stage 11 in a carrier block 1A, and the wafer W in the carrier 10 is transferred to a process block 1B by a transfer arm 12. The wafer W is conveyed to a coating unit 13A in the process block 1B where the wafer W is coated with a resist liquid, and then the wafer W is conveyed to an exposure apparatus 1D through an interface block 1C.

The exposed wafer is returned to the process block 1B where the wafer is subjected to a developing process in a developing unit 13B, and then the wafer is returned to the original carrier 10. Reference sign 14 (14a to 14c) denotes unit stacks, each provided with a heating unit and a cooling unit for heating and/or cooling a wafer W before and after the process performed by a coating unit 13A and/or developing unit 13B, and a transfer stage. In the process block 1B, the wafer W is transferred among the coating unit 13A, the developing unit 13B and the unit stacks 14a to 14c by transfer means 15A and 15B disposed in the process block 1B. In this case, all the wafers are transferred according to a transferring schedule specifying the timing at which each wafer is carried into respective units.

In the coating and developing apparatus of JP2004-193597A, since a common transfer means transfers a wafer to units for processing a wafer before exposure (e.g., a unit for resist film formation) and also transfers a wafer to units for processing a wafer after exposure (e.g., a developing unit), it is difficult to arrange an effective transferring schedule and thus to improve the throughput. This is contrary to the demands of improving the throughput of the coating and developing apparatus consistent with the improvement of the throughput of the exposing apparatus.

JP2001-176792A (JP3337677B2) discloses a coating and developing apparatus provided with an area for coating process and an area for developing process, wherein the areas are vertically separated from each other, and are provided therein with individual transfer means.

A certain kind of resist film requires antireflective film(s) formed over and/or under the resist film. In this case, if a unit block (i.e., a block composed of plural processing units) for forming a resist film, a unit block for forming an antireflective film before forming the resist film, a unit block for forming an antireflective film after forming the resist film and a unit block for developing process are stacked vertically, the total height of the coating and developing apparatus increases. Thus, it is difficult to transport the coating and developing apparatus from the manufacturing maker of the apparatus to the user. Moreover, the maintenance of the apparatus is difficult.

On the contrary, if liquid processing units such as a resist film coating unit and an antireflective film forming units are arranged in a plane, the footprint of the apparatus drastically increases.

DISCLOSURE OF THE INVENTION

The present invention has been made under the foregoing circumstances, and it is therefore an object of the present invention to provide a coating and developing apparatus that achieves reduction in height and length thereof to a reasonable degree while achieving high transferring efficiency in the apparatus.

In order to achieve the objectives, the present invention provides a coating and developing apparatus comprising a carrier block, a process block, and an interface block connectable to an exposure apparatus, wherein the coating and developing apparatus is configured to: transfer a substrate carried into the carrier block by using a carrier to the process block; coat the substrate with a coating film including a resist film in the process block; send the substrate to the exposure apparatus through the interface block; develop the substrate, which has been exposed and returned to the process block through the interface block, in the process block; and then transfer the substrate to the carrier block, wherein:

(a) the process block is provided with a plurality of unit blocks each including: a liquid processing unit for applying a chemical liquid onto a substrate; a heating unit for heating a substrate; a cooling unit for cooling a substrate; and a conveyer for the unit block for transferring a substrate among those units, and wherein each of the unit blocks is provided therein with a conveying passage extending from a carrier-block side thereof to an interface-block side thereof;

(b) the process block is provided with a first unit-block stack formed by stacking a plurality of unit blocks and a second unit-block stack formed by stacking a plurality of unit blocks, wherein the first unit-block stack is disposed on a carrier-block side and the second unit-block stack is disposed on a interface-block side;

(c) intermediate stages are disposed between the first unit-block stack and the second unit-block stack such that each of the intermediate stages is disposed between unit blocks located on the same level to transfer a substrate therebetween;

(d) the first unit-block stack comprises: a unit block for bottom antireflective film formation including a liquid processing unit for applying a chemical liquid for forming a bottom antireflective film to a substrate before a resist liquid is applied to the substrate; a unit block for resist film formation including a liquid processing unit for applying a resist liquid to a substrate; and a unit block for development including a liquid processing unit for applying a developing liquid to an exposed substrate to develop the same;

(e) the second unit-block stack comprises: a unit block for resist film formation including a liquid processing unit for applying a resist liquid to a substrate; a unit block for top antireflective film formation including a liquid processing unit for applying a chemical liquid for forming a top antireflective film to a substrate after a resist liquid is applied to the substrate; and a unit block for development including a liquid processing unit for applying a developing unit to an exposed substrate to develop the same;

(f) the unit block for resist film formation of the second unit-block stack is located on the same level as that of the unit block for bottom antireflective film formation of the first unit-block stack; the unit block for top antireflective film formation of the second unit-block stack is located on the same level as that of the unit block for resist film formation of the first unit-block stack; and the unit block for development of the second unit-block stack is located on the same level as that of the unit block for development of the first unit-block stack;

(g) said apparatus has processing modes including:

a first processing mode in which an antireflective film is formed on the substrate in the unit block for bottom antireflective film formation of the first unit-block stack; the substrate is transferred through an intermediate stage corresponding to said unit block for bottom antireflective film formation of the first unit-block stack to the unit block for resist film formation of the second unit-block stack; and in which unit block a resist film is formed on the substrate; and a second processing mode in which a resist film is formed on the substrate in the unit block for resist film formation of the first unit-block stack; the substrate is transferred through an intermediate stage corresponding to said unit block for resist film formation of the first unit-block stack to the unit block for top antireflective film formation of the second unit-block stack; and in which unit block an antireflective film is formed on the substrate.

In one preferred embodiment, the coating and developing apparatus further includes a vertically-movable transfer device for transferring a substrate between the unit block for resist film formation of the second unit-block stack and the unit block for top antireflective film formation of the second unit-block stack, wherein said apparatus has a third processing mode in which: an antireflective film is formed on the substrate in the unit block for bottom antireflective film formation of the first unit-block stack; the substrate is transferred through an intermediate stage corresponding to said unit block for bottom antireflective film formation of the first unit-block stack to the unit block for resist film formation of the second unit-block stack; in which unit block a resist film is formed on the substrate; from which unit block the substrate is transferred via the vertically-movable transfer device to the unit block for top antireflective film formation of the second unit-block stack; and in which unit block a top antireflective film is formed on the substrate.

In one preferred embodiment, the coating and developing apparatus further includes a vertically-movable transfer device for transferring a substrate between the unit block for bottom antireflective film formation of the first unit-block stack and the unit block for resist film formation of the first unit-block stack, wherein said apparatus has a fourth processing mode in which: an antireflective film is formed on the substrate in the unit block for bottom antireflective film formation of the first unit-block stack; from which unit block the substrate is transferred via the vertically-movable transfer device to the unit block for resist film formation of the first unit-block stack; in which unit block a resist film is formed on the substrate; the substrate is transferred through an intermediate stage corresponding to said unit block for resist film formation to the unit block for top antireflective film formation of the second unit-block stack; and in which unit block stack a top antireflective film is formed on the substrate.

One of the unit block for development of the first unit-block stack and the unit block for development of the second unit-block stack may be replaced with a unit block for inspection including an inspecting unit for inspecting a surface of a substrate and a conveyer for the unit block for transferring a substrate between the inspecting unit and an intermediate stage.

DESCRIPTION OF REFERENCE SIGNS

Figure 1:
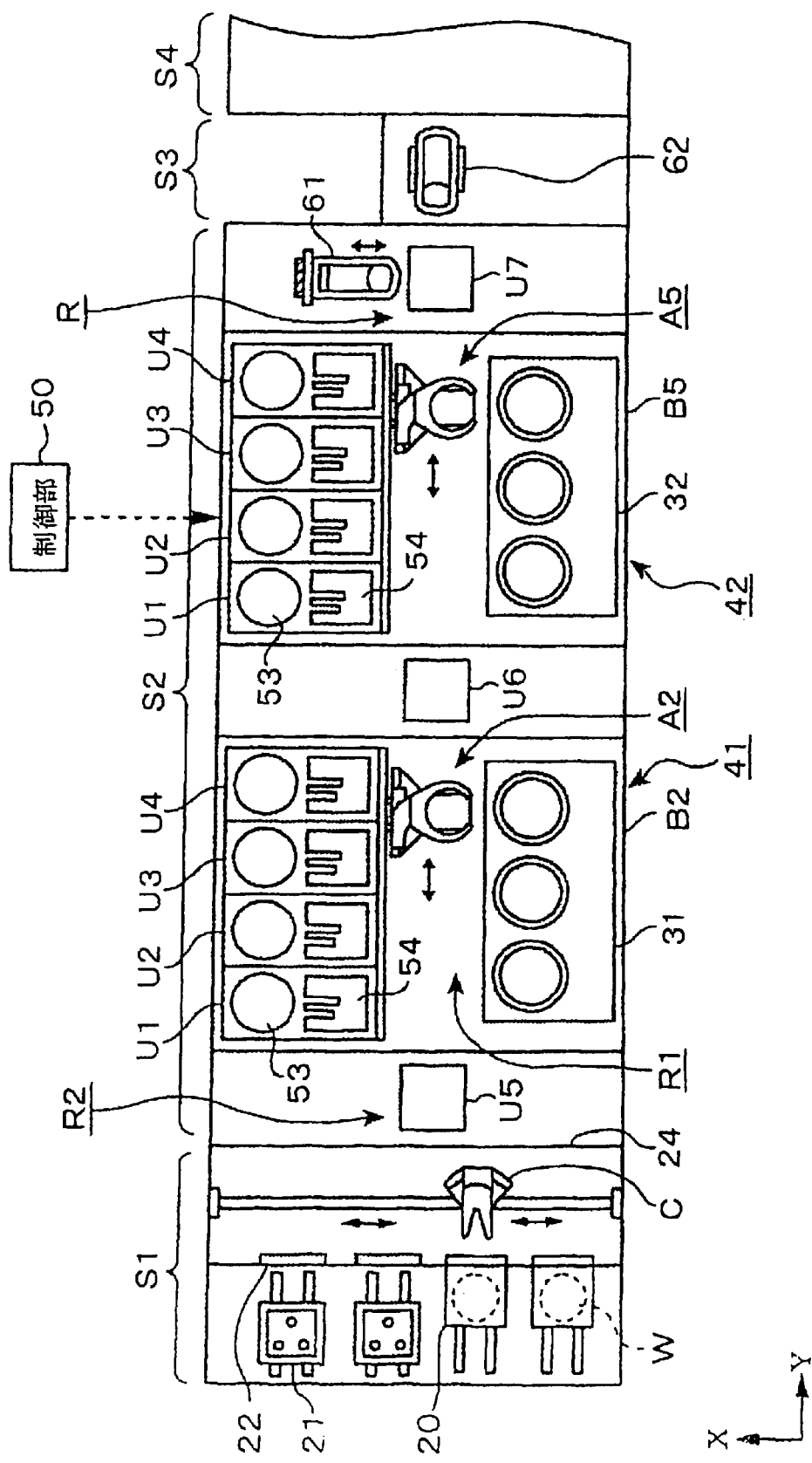
FIG. 1 is a schematic top plan view of a coating and developing apparatus in a first embodiment of the present invention.
Figure 2:
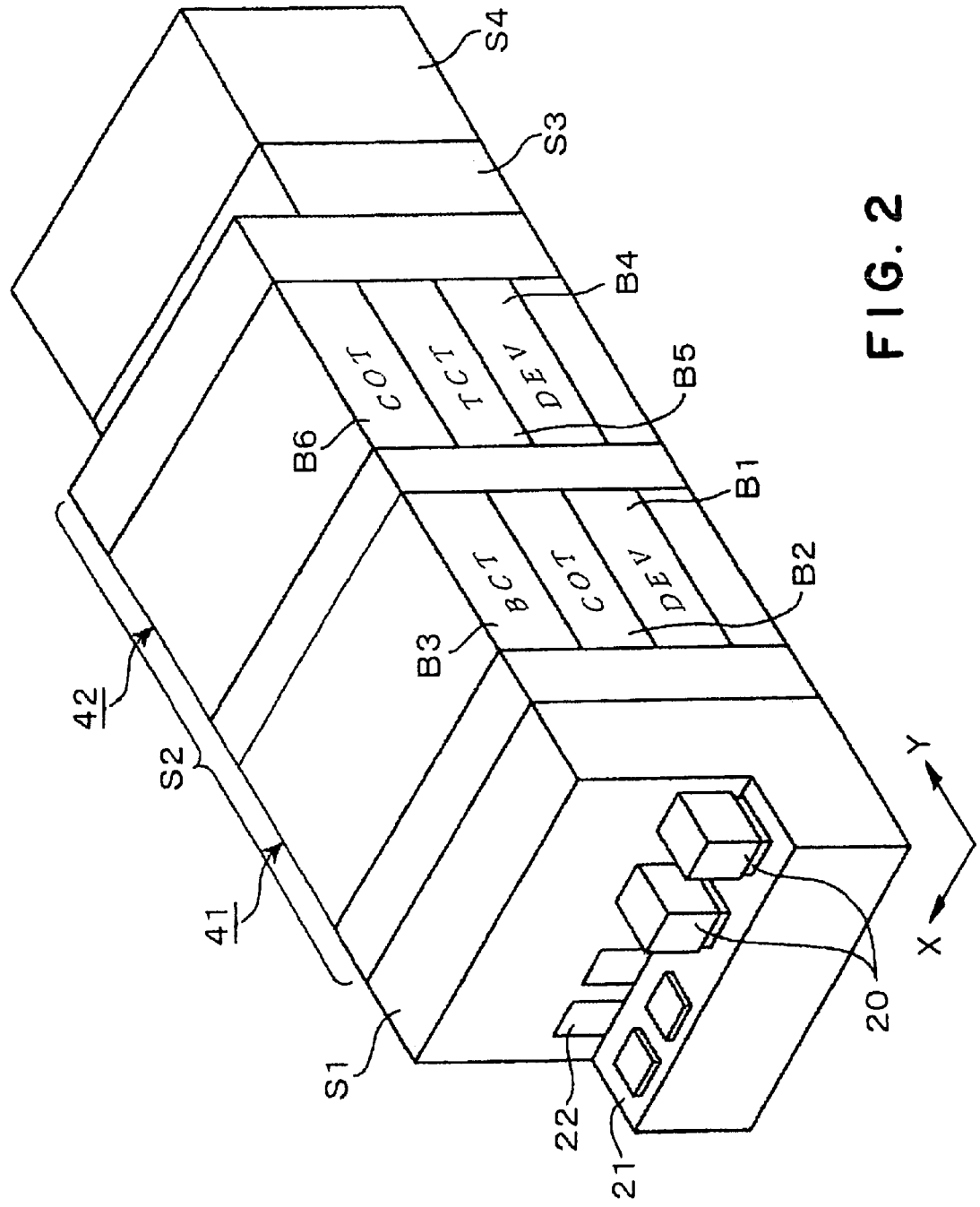
FIG. 2 is a schematic perspective view of the coating and developing apparatus shown in FIG. 1.

W: Semiconductor wafer
20: Carrier
C: Transfer arm
S1: Carrier block
S2: Process block
S3: Interface block
S4: Exposure apparatus
A1 to A7: Main arm
31: Coating unit
41: First unit-block stack
42: Second unit-block stack
TRS6 to TRS8: Intermediate stage
61: Transfer arm (Vertically-movable transfer device)
62: Interface arm (Vertically-movable transfer device)
63: Transfer arm (Vertically-movable transfer device)
50: Control unit
B1 to B7: Unit block

BEST MODE FOR CARRYING OUT THE INVENTION

A first embodiment of the coating and developing apparatus according to the present invention will be described with reference to FIGS. 1 to 6. In the first embodiment, the coating and developing apparatus according to the present invention is connected to an exposure apparatus and is constituted as a part of a resist pattern forming system. For the convenience of the explanation, the positive X-direction in the drawings is referred to as left direction; the negative X-direction is referred to as right direction; the positive Y-direction is referred to as front direction; and the negative Y-direction is referred to as rear direction. As shown in FIG. 1, the coating and developing apparatus includes: a carrier block S1 for receiving and delivering a hermetically-closed carrier 20, holding plural (e.g., 13) wafers W (i.e., substrates) therein, into and from the coating and developing apparatus; a process block S2 for performing a coating process and a developing process to the wafers W; and an interface block S3. The coating and developing apparatus is connected to an exposure apparatus S4 via the interface block S3.

The carrier block S1 is provided with: a stage 21 adapted to hold plural carriers 20 thereon; openings formed in a wall in front of the stage 21; and a transfer arm C for removing a wafer W from the carrier 20 through the opening. A shutter is assigned to each of the openings 22 to close the same. The transfer arm C is capable of moving toward and away from transfer stages TRS1, TRS2 and TRS3 (described later), or moving in Y-directions; moving vertically; rotating about a vertical axis; and moving along the carrier arranging direction, or X-directions, in order to transfer a wafer W to and from the transfer stages TRS1, TRS2 and TRS3.

The process block S2 enclosed by an enclosure is connected to the carrier block S1 at the front end of the process block S2. The process block S2 includes a first unit-block stack 41 disposed near the carrier block S1 and a second unit-block stack 42 disposed near the interface block S3. Each of the unit-block stacks are constituted by stacking plural unit blocks vertically, which will be described later. Each of the unit blocks is provided therein with a wafer transfer passage (transfer area) extending linearly from the process block S2 side to the interface block S3 side.

The first unit-block stack 41 is constituted by stacking: a unit block for development (DEV layer) B1 for applying a developing liquid to an exposed wafer W to perform a developing process; a unit block for resist film formation (COT layer) B2 for coating a wafer W with a resist liquid; and a unit block for bottom antireflective film formation (BCT layer) B3 for coating a chemical liquid for forming a bottom antireflective film on a wafer before coated with a resist liquid, wherein these unit blocks B1, B2 and B3 are stacked in that order from the bottom. The second unit-block stack 42 is constituted by stacking: a unit block for development (DEV layer) B4 for applying a developing liquid to an exposed wafer W to perform a developing process; a unit block for top antireflective film formation (TCT layer) B5 for coating a chemical liquid for forming a top antireflective film on a wafer after coated with a resist liquid; and a unit block for resist film formation (COT layer) B6 for coating a wafer W with a resist liquid, wherein these unit blocks B4, B5 and B6 are stacked in that order from the bottom. Note that the term "layer" and the term "unit block" has the same meaning, and that either one of these terms are used hereinafter depending on the circumstances for the sake of convenience of explanation. The DEV layer B1, the COT layer B2 and the BCT layer B3 are positioned at the same level as those of the DEV layer B4, the TCT layer B5 and the COT layer B6, respectively.

Intermediate stages TRS6, TRS7 and TRS8, serving as transfer stages, are arranged between the first unit-block stack 41 and the second unit-block stack 42. The intermediate stages TRS6, TRS7 and TRS8 are arranged at positions respectively corresponding to the unit blocks B1, B2 and B3 (B4, B5 and B6); in other words, each of the intermediate stages TRS6, TRS7 and TRS8 are arranged at a position to and from which each of main arms (described later) provided in the corresponding unit blocks can transfer a wafer W. The intermediate stages TRS6, TRS7 and TRS8 are stacked vertically to constitute a unit stack U6.

Next, the structure of the unit blocks B1 to B6 will be described. Each of the unit blocks B1 to B6 includes: a liquid processing unit (i.e., coating unit, described later) for applying a chemical liquid to a wafer W; various heating unit(s) and cooling unit(s) that performs a pre-treatment and a post-treatment for the treatment performed by the liquid processing unit; a main arm (A1 to A6) that transfers a wafer W between the liquid processing unit and the heating and cooling units.

Among the unit blocks B1 to B6, the positional relationship among the liquid processing unit, the heating and cooling units and the main arm is the same. In other words, among the unit blocks, the positional relationship among the wafer-mounting positions (e.g., the center position of the spin chuck (described later) of the liquid processing unit, and the center positions of the heating (or cooling) plates of the heating (or cooling) units are the same.

The structure of the unit block will be described taking the COT layer B2 shown in FIGS. 1 and 4 as an example. Provided at the center in the COT layer B2 is a wafer transfer area (i.e., transfer passage) R1 extending in the front-and-rear direction (i.e., Y-direction). Arranged on the right side of the transfer area R1 is a coating unit 31, as the liquid processing unit, having plural coating portions for coating a resist. Arranged on the left side of the COT layer B2 are four unit stacks U1, U2, U3 and U4, which are aligned in the front-and-rear direction. Each of the unit stacks is composed of vertically-stacked two heating and/or cooling units for performing a pre-treatment and a post-treatment for the treatment performed by the coating unit 31. The transfer area R1 is defined between the coating unit 31 and the unit stacks U1 to U4. Clean air is sprayed to the transfer area R1 and is discharged therefrom, thereby to prevent particles from being suspended in the transfer area R1.

Figure 4:
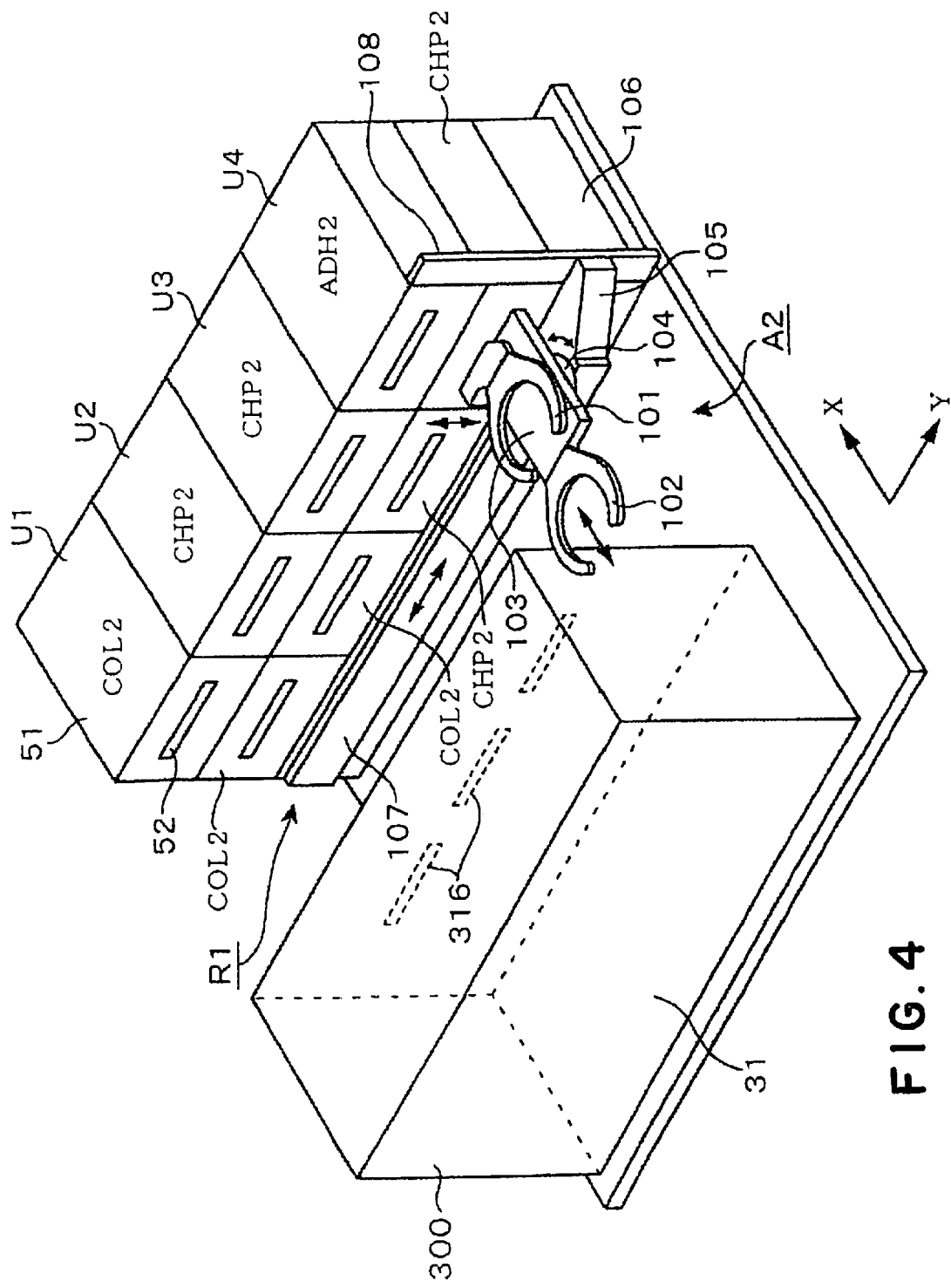
FIG. 4 is a schematic perspective view showing the structure of one unit block in the coating and developing apparatus shown in FIG. 1.

As shown in FIG. 4, the foregoing processing units for performing the pre-treatment and the post-treatment includes: a cooling unit (COL2) for adjusting the temperature of a wafer W to a designated value before the wafer W is coated with a resist liquid; and a heating unit (CHP2), or a so-called, pre-baking unit, for heating a wafer W after coated with a resist liquid. The processing units such as the cooling unit (COL2) and the heating unit (CHP2) are enclosed by respective processing containers 52. The side of each processing container 52 facing the transfer area R1 is provided therein with a wafer carrying-in-and-out port. Each of the unit stacks U1 to U4 are constituted by stacking the processing containers 52. As shown in FIG. 1, each heating unit (CHP2) includes a heating plate 53, and a cooling plate 54 which also functions as a transfer arm. The processing units constituting the unit stacks U1 to U4 includes a hydrophobizing unit (ADH2) that performs a hydrophobizing treatment by supplying the wafer surface with an organic gas in order to improve the adhesion of the resist film to the wafer surface.

The main arm (conveyer) A2 disposed in the transfer area R1 is capable of: moving toward and away from each processing units in the COT layer B2, or moving in X-direction; moving vertically; rotating about a vertical axis; and moving in Y-direction, so that the main arm A2 can transfer a wafer W to and from any one of the processing units in the COT layer B2, the transfer stage TRS2 and the intermediate stage TRS7.

Figure 3:
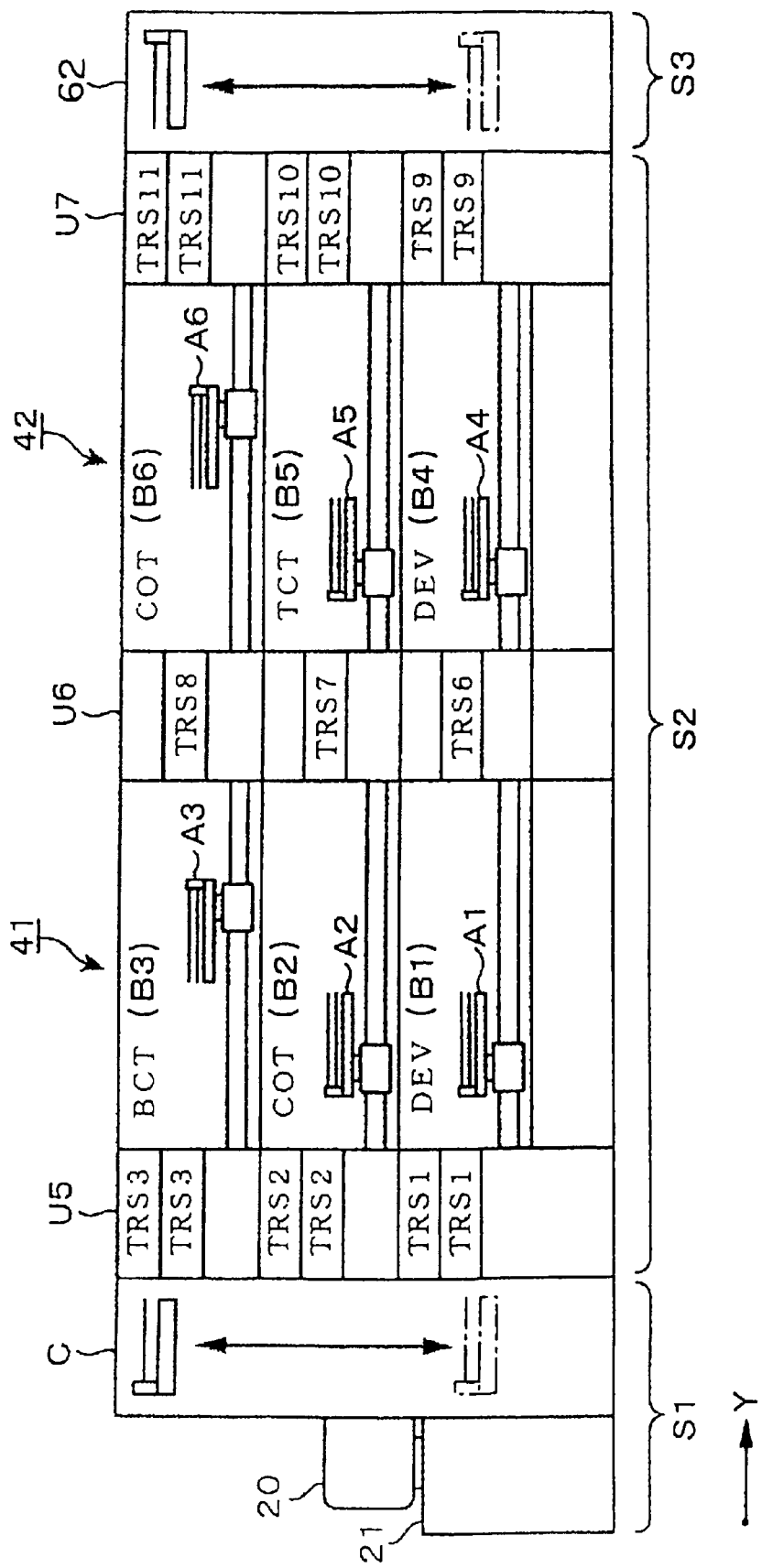
FIG. 3 is a schematic longitudinal cross-sectional view of the coating and developing apparatus shown in FIG. 1.

As shown in FIGS. 1 and 3, a unit stack U5 is arranged between the carrier block S1 and the first unit-block stack 41. The unit stack U5 comprises transfer stages TRS1, TRS2 and TRS3, which are stacked vertically. Two transfer stages TRS1, two transfer stages TRS2 and two transfer stages TRS3 are provided in correspondence to the unit blocks B1, B2 and B3, respectively. The main arm (A1 to A3) in each unit block can transfer a wafer W to and from the corresponding transfer stages. The transfer arm C is capable of transferring a wafer W to and from any one of the transfer stages TRS1 to TRS3 constituting the unit stack U5.

A unit stack U7 is arranged between the second unit-block stack 42 and the interface block S3. The unit stack U7 comprises transfer stages TRS9, TRS10 and TRS11, which are stacked vertically. Two transfer stages TRS9, two transfer stages TRS10 and two transfer stages TRS11 are provided in correspondence to the unit blocks B4, B5 and B6 of the second unit-block stack 42, respectively. The main arm (A4 to A6) in each unit block can transfer a wafer W to and from the corresponding transfer stages.

As shown in FIG. 1, the process block S1 is provided with a transfer arm (transfer means) 61 near the unit stack U7. The transfer arm 61 is capable of: moving toward and away from the transfer stages TRS10 and TRS11, or in X-direction; and of moving vertically, so that the transfer arm 61 can transfer a wafer W to and from the transfer stages TRS10 and TRS11. The transfer arm 61 has a function of transferring a wafer, having been transferred from the COT layer B6 to the transfer stage TRS11, to the transfer stage TRS10 corresponding to the TCT layer B5, which will be described later.

The exposure apparatus S4 is connected to the front side of the unit stack U6 of the process block S2 via the interface block S3. The interface block S3 is provided therein with an interface arm 62 to transfer a wafer W between the unit stack U7 of the process block S2 and the exposure apparatus S4. The interface arm 62 serves as a wafer transfer means interposed between the process block S2 and the exposure apparatus S4. The interface arm 62 is capable of: moving toward and away from the transfer stages TRS9 to TRS11, or moving in Y-direction; moving vertically; and rotating about a vertical axis, so that the interface arm 62 can transfer a wafer W to and from any one of the transfer stages TRS9 to TRS11 of the unit stack U7.

When a wafer W is transferred from the COT layer B6 to the TCT layer B5, it is advantageous, in view of reducing the load of the interface arm 62, that the wafer is transferred from the stage TRS11 to the stage TRS10 by means of the transfer arm 61. In spite of the above, the transfer arm 61 may be omitted; and a wafer W may be transferred from the stage TRS11 to TRS10 by means of the interface arm 62.

Next, the other unit blocks will be briefly described. As previously described, the DEV layer B1, the DEV layer B2, the BCT layer B3 and TCT layer B5 have essentially the same structure as that of the COT layer B2 and the COT layer B6. The DEV layer B1 and the DEV layer B2 are different from the BCT layer B3 and TCT layer B5 in the following respects: the chemical liquid used in the coating unit 31, or the liquid processing unit (a chemical liquid for antireflective film formation is used in the BCT layer and the TCT layer; while a chemical liquid for development, or a developing liquid is used in the DEV layer); the way how the chemical liquid is applied; and the process conditions in the heating and cooling units. The DEV layer B1 are the DEV layer B2 are the same as the BCT layer B3 and TCT layer B5 in that the main arm (A1, A3, A4, A5) assigned to each unit block (layer) transfers a wafer W between the processing units of the unit block, and transfers a wafer W to and from the transfer stages or the intermediate stages of the unit stack U5, U6 and U7. Note that, in the TCT layer B5 and the COT layer B6 of the second unit-block stack 42, in order to expose only the edge portion of a wafer W prior to the exposure process to be carried out after completion of the processes performed in these layers, an edge exposure unit (WEE) is incorporated into the unit stack U4 of each of these layers.

Figure 5:
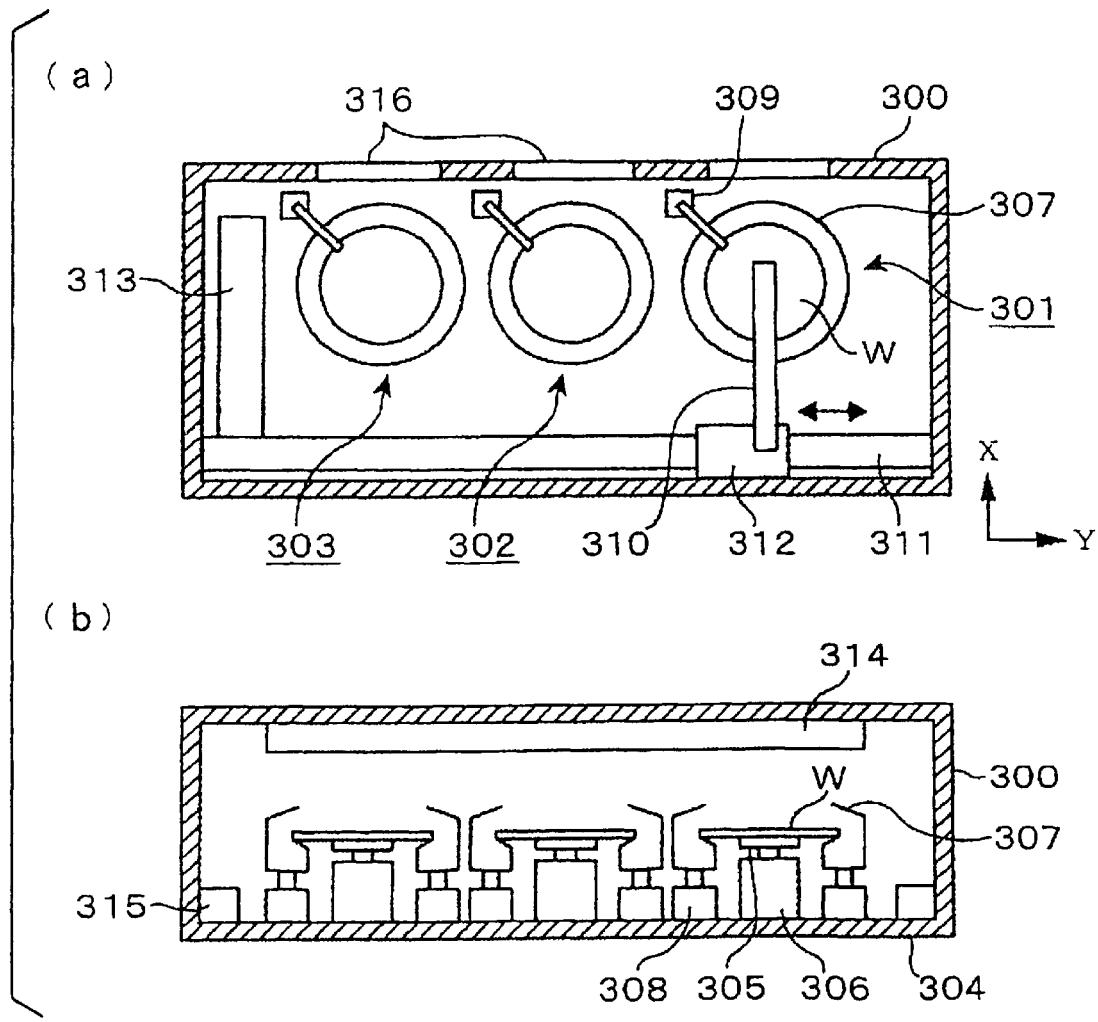
FIG. 5 shows a schematic top plan view and a schematic cross-sectional view of a coating unit shown in FIG. 4.

Next, the coating unit 31 will be briefly described with reference to FIG. 5. The coating unit 31 has plural (in the illustrated embodiment, three) coating portions 301, 302 and 303, which are enclosed in a common processing container 300. These coating portions are mounted on a common base 304 and are aligned in front-and-rear direction (Y-direction).

The coating portions 301, 302 and 303 have the same structure, and thus the structure thereof will be described taking the coating portion 301 as an example. Reference numeral 305 denotes a spin chuck, or a substrate holder. The spin chuck 305 is adapted to hold a wafer W horizontally by suction. The spin chuck 305 is capable of rotating about a vertical axis and moving vertically by means of a driving mechanism. A cup 307 surrounds the spin chuck 305. A drainage system 308 including an exhaust pipe and a drainage pipe is disposed on the bottom of the cup 307. Reference numeral 309 denotes a side rinse mechanism for supplying a rinse liquid to the peripheral edge portion of a wafer W held by the spin chuck 305. The side rinse mechanism 309 is capable of moving vertically and rotating about a vertical axis.

Reference numeral 310 denotes a common supply nozzle (chemical liquid nozzle) for supplying a coating liquid to the three coating portions 301, 302 and 303. The supply nozzle 310 is capable of moving along a guide rail 311 extending in the longitudinal direction (i.e., the front-and-rear direction, or Y-direction) of the processing container 300 from a position outside the cup 307 of the coating portion 301 on one end to a position outside the cup 307 of the coating portion 301 on the other end. The supply nozzle 310 is also capable of moving vertically. Thus, the supply nozzle 310 is capable of supplying a resist liquid to any one of the center portions of wafers W held by the spin chucks 305 of the coating portions 301 to 303. Reference numeral 313 denotes a stand-by area for the supply nozzle 310 disposed outside the coating portion 301 on one end.

Reference numeral 314 denotes a filter unit mounted on the ceiling of the processing container 300; and reference numeral 315 denotes an exhaust unit mounted on the bottom of the processing container 300. The atmosphere in the processing container 300 is discharged by means of the exhaust unit 315 at a predetermined flow rate while clean air whose temperature and humidity are controlled is supplied into the processing container 300 through the filter unit 314 at a predetermined flow rate, whereby clean-air downflow is formed in the processing container 300 and the pressure in the processing container 300 is maintained at a value slightly higher than that in the transfer area R1 for the main arm A2. Reference numeral 316 denotes wafer carrying-in-and-out ports which are formed in the side, facing the transfer area R1, of the processing container 300. The carrying-in-and-out ports 316 correspond to the coating portions 301, 302 and 303, respectively.

At the coating unit 31, a wafer W is carried into the processing container 300 through a carrying-in-and-out port 316, and is transferred to the spin chuck 315 of one of the coating portions 301, 302 and 303. The supply nozzle 310 supplies a resist liquid onto the center portion of the wafer W and the spin chuck 305 rotates, whereby the resist liquid spreads in radial directions of the wafer W and thus a liquid film of the resist is formed on the surface of the wafer W. The wafer W, on which the liquid film of the resist is thus formed, is carried out of the coating unit 31 through the carrying-in-and-out port 316.

With the coating unit 31, as three coating portions 301 to 303 is arranged in one common processing container 301, the process atmospheres in respective coating portions are the same. Thus, one supply nozzle 310 may be shared by the three coating portions to supply these coating portions with a resist liquid. The arrangement achieves reduction in the total number of the component parts and the footprint of the coating unit, as compared with the case where each of the coating portions 301 to 303 has individual processing container 300 and supply nozzle 310.

Referring back to FIG. 1, the coating and developing apparatus has a control unit 50. Processing modes of the coating and developing apparatus can be specified by the control unit 50. The term "processing mode" may be regarded as a set of units which a wafer W sequentially goes through when the wafer W is transferred through the process block S2. Specifying of the process mode may be executed by: (i) sequentially specifying (inputting) the units which a wafer W should sequentially go through; (ii) sequentially specifying (inputting) the unit blocks which a wafer W should sequentially go through; or (iii) selecting a desired process type from the process menu. In the case (iii), a set of units (or unit blocks) which a wafer W should go through are determined beforehand in correspondence to respective process types; upon selecting a process type from the process menu, a set of units, which a wafer W should sequentially go through when the wafer W is transferred, is automatically specified. The control unit 50 may have the following function: even if a certain unit block is selected to process a certain wafer W, in a case where the process schedule in a certain unit of said certain unit block for processing said certain wafer W overlaps the process schedule for another wafer W, the control unit 50 automatically designates another unit in said certain unit block having the same function as that of said certain unit in order to process said certain wafer W.

The process modes may be illustrated as follows:

(1) Process mode M1 in which a wafer W is transferred to the BCT layer B3 of the first unit-block stack 41, and the COT layer B6 of the second unit-block stack 42, in that order;

(2) Process mode M2 in which a wafer W is transferred to the COT layer B2 of the first unit-block stack 41, and the TCT layer B5 of the second unit-block stack 42, in that order;

(3) Process mode M3 in which a wafer W is transferred to the BCT layer B3 of the first unit-block stack 41, the COT layer B6 of the second unit-block stack 42, and the TCT layer B5 of the second unit-block stack 42, in that order;

(4) Process mode M4 in which a wafer W is transferred to the BCT layer B3 of the first unit-block stack 41, the COT layer B2 of the first unit-block stack 41, and the TCT layer B5 of the second unit-block stack 42, in that order;

(5) Process mode M5 in which only the COT layer B2 of the first unit-block stack 41; and (6) Process mode M6 in which only the COT layer B6 of the second unit-block stack 42.

Although only the processes before exposure are described in connection with the process modes (1) to (6), it should be noted that the wafer W is transferred to the exposure apparatus S4 where the wafer W is exposed, and the wafer W is transferred to the DEV layer B4 or the DEV layer B1 where the wafer W is developed, regardless of which process mode is selected.

Next, the operation of the coating and developing apparatus will be described. The description will be made assuming that the process mode M1 is selected by the control unit 50. A carrier 20 is carried into the carrier block S1 from the outside the apparatus. A wafer W is removed from the carrier 20 by the transfer arm C. The wafer W is transferred from the transfer arm C to the transfer stage TRS3 of the unit stack U5, and then is transferred to the main arm A3 of the BCT layer B3 of the first unit-block stack 41. In the BCT layer B3, the wafer W is sequentially transferred to the cooling unit (COL, not shown), the antireflective film forming unit (not shown) and the heating unit (CHP, not shown) in that order by the main arm A3, whereby a first antireflective film is formed on the wafer W. Note that the antireflective film forming unit has essentially the same structure as the coating unit 31 shown in FIGS. 1, 4 and 5; and although the arrangement of the processing units in the BCT layer B3 are not shown, those skilled in the art can readily understand the transferring operation of the wafer W in the BCT layer B3, since the arrangement of the BCT layer B3 is essentially the same as that of the COT layer B2 shown in FIG. 4 as previously described.

Figure 6:
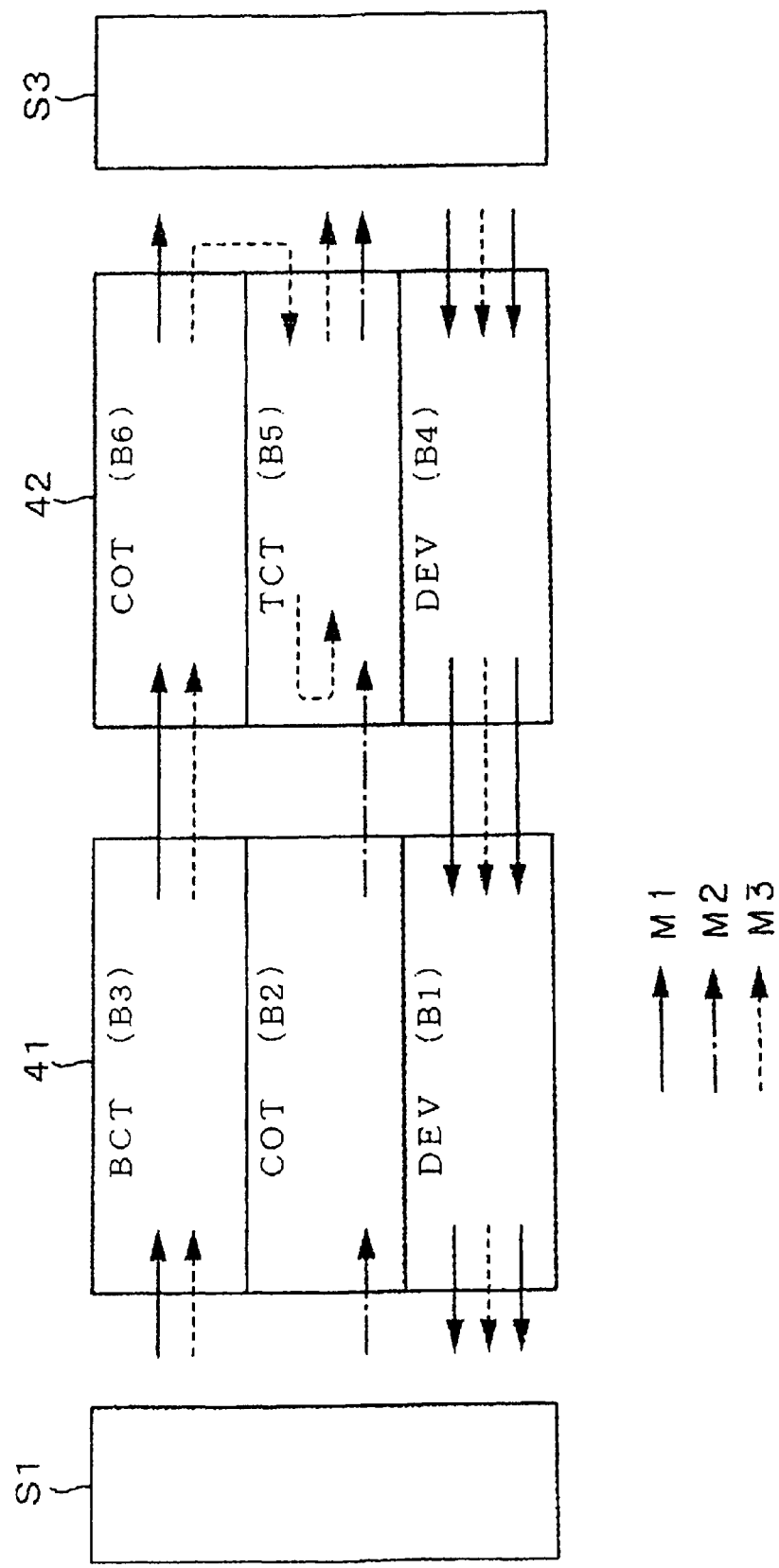
FIG. 6 is an explanatory drawing showing the flow of a wafer in the coating and developing apparatus shown in FIG. 1.

Next, the wafer W is transferred to the intermediate stage TRS8 of the unit stack U6 by the main arm A3, and then is transferred to the main arm A6 of the COT layer B6 of the second unit-block stack 42. In the COT layer B6, the wafer is sequentially transferred to the hydrophobizing unit (ADH, not shown), the cooling unit (COL, not shown), the coating unit 31 (not shown) and the heating unit (CHP, not shown) in that order by the main arm A6, whereby a resist film is formed on the wafer W. The wafer W is further transferred by the main arm A6 to the edge exposure unit (WEE, not shown), in which the peripheral edge portion of the wafer W is exposed. Thereafter, the wafer W is transferred to the transfer stage TRS11 by the main arm A6, and is transferred to the exposure apparatus S4, in which the wafer W is subjected to a predetermined exposure process. Note that although the arrangement of the processing units in the COT layer B6 are not shown, those skilled in the art can readily understand the transferring operation of the wafer W in the COT layer B6, since the arrangement of the COT layer B6 is essentially the same as that of the COT layer B2 shown in FIG. 4 as previously described. In FIG. 6, the flow of the wafer W in the process mode M1 is shown by solid arrows.

The exposed wafer W is transferred to the transfer stage TRS9 of the unit stack U6 by the interface arm 62, and is received by the main arm A4 of the DEV layer B4. In the DEV layer B4, the wafer W is sequentially transferred to the heating nit (PEB, not shown), the cooling unit (COL, not shown), the developing unit (not shown) and the heating unit (POST, not shown) in that order by the main arm A4, whereby the wafer W is subjected to a predetermined developing process. The wafer W thus developed is transferred to the main arm A1 of the DEV layer B1 through the intermediate stage TRS6 of the unit stack U6, and then is transferred to the transfer arm C through the transfer stage TRS1 of the unit stack U5, and is returned to the original carrier 20 placed on the carrier block S1. Note that although the arrangement of the processing units in the DEV layer B4 are not shown, those skilled in the art can readily understand the transferring operation of the wafer W in the DEV layer B4, since the arrangement of the DEV layer B4 is essentially the same as that of the COT layer B2 shown in FIG. 4 as previously described. Instead of performing the developing process in the DEV layer B4, the wafer W may be transferred to. the DEV layer B1 through the DEV layer B4 and thus may be developed in the DEV layer B1. As the developing process requires a longer processing time than the antireflective film forming process and the resist film forming process, both the DEV layers B1 and B4 are generally used.

The description will be made assuming that the process mode M2 is selected. In this case, a wafer W held in a carrier 20 is transferred to the transfer stage TRS2 of the unit stack U5 by the transfer arm C, is received by the main arm A2 of the COT layer B2, and is subjected to a resist film forming process in the COT layer B2. Then, the wafer W is transferred through the intermediate stage TRS7 of the unit stack U6 to the main arm A5 of the TCT layer B5, in which layer the wafer W is subjected to a series of process steps identical with the process steps performed in the BCT layer B3 in the process mode M1, whereby an antireflective film is formed on the resist film. In FIG. 6, the flow of the wafer W in the process mode M2 is indicated by chain-dotted arrows. Then, the wafer W is transferred to the transfer stage TRS10 of the unit stack U7, and thereafter the wafer W is subjected to the same transferring operation and process as those in the process mode M1.

The description will be made assuming that the process mode M3 is selected. In this case, an antireflective film is formed on a wafer W in the BCT layer B3 of the first unit-block stack 41, and subsequently the wafer W is transferred through the intermediate stage TRS8 of the unit stack U6 to the COT layer B6 of the second unit-block stack 42, in which a resist film is formed on the wafer W. Until this point, the same procedure as that in the process mode M1 is performed. Then, the wafer W is transferred to the transfer stage TRS11 of the unit stack U7, and subsequently is transferred to the transfer stage TRS10 by the transfer arm 61. Thereafter, the wafer W is received by the main arm A5 of the TCT layer B5, and an antireflective film is then formed on the resist film formed on the wafer W in the TCT layer B5. Then, the wafer W is transferred to the transfer stage TRS10 of the unit stack U7, and thereafter the wafer W is subjected to the same transfer operation and process as those in the process mode M2. In FIG. 6, the flow of the wafer W in the process mode M3 is indicated by broken arrows.

Next, the description will be made assuming that the process mode M4 is selected. In this case, although a wafer W is sequentially transferred to the BCT layer B3 of the first unit-block stack 41, the COT layer B2 of the first unit-block stack 41 and the TCT layer B5 of the second unit-block stack 42 in that order, the wafer W is subjected to the same process steps as those in the process mode M3. If the process mode M5 or the process mode M6 is selected, only the COT layer B2 or the COT layer B6 is used, and a wafer W having only a resist film formed thereon is transferred to the exposure apparatus S4.

In the foregoing first embodiment: (a) the processing units relating to a liquid process and the transfer means are integrated to form a unit block; (b) the unit blocks relating to pre-exposure coating processes (the COT layers B2 and B6, the BCT layer B3 and the TCT layer B5) and the unit blocks relating to post-exposure developing process (the DEV layers B1 and B4) are vertically separated from each other; (c) the unit blocks for pre-exposure coating processes are allocated, with respect to the front-and-rear direction, to the first unit-block stack 41 and the second unit-block stack 42; (d) the wafer transfer path is different from each other among the case where an antireflective film is formed only above the resist film, the case where an antireflective film is formed only under the resist film and the case where antireflective films are formed both above and under the resist film. As a substrate before exposure is transferred by a transfer means different from a transfer means for transferring a substrate after exposure in the process block S2, high transferring efficiency can be achieved. The height of the coating and processing apparatus can be reduced as compared with the case where all the unit blocks involving the coating processes are aligned in one vertical row. Thus, the maintenance of the coating and developing apparatus can be readily performed. The footprint of the coating and processing apparatus can be reduced as compared with the case where all the unit blocks involving the coating processes are arranged in one layer.

In addition, in the foregoing first embodiment, as the intermediate stage TRS7 or TRS8 is disposed between the unit blocks of the unit-block stacks 41 and 42 of the same level (between B3 and B6; or between B2 and B5), a wafer W can be transferred between the unit blocks of the same level by means of the transfer means arranged in the respective unit blocks. Thus, the provision of a transfer means exclusively for transferring a wafer W between the unit-block stacks 41 and 42 is not necessary, simplifying the structure of the transfer system. In the illustrated embodiment, although only one intermediate stage TRS7 and only one intermediate stage TRS8 are provided, each of the intermediate stages TRS7 and TRS8 may number plural to match the throughput of the respective unit blocks (between B3 and B6; or between B2 and B5) with each other. Note that it is enough if each of the stages TRS1 to 11 is configured so that a wafer is can be temporarily placed thereon and the main arm can place a wafer thereon and remove a wafer therefrom.

Figure 7:
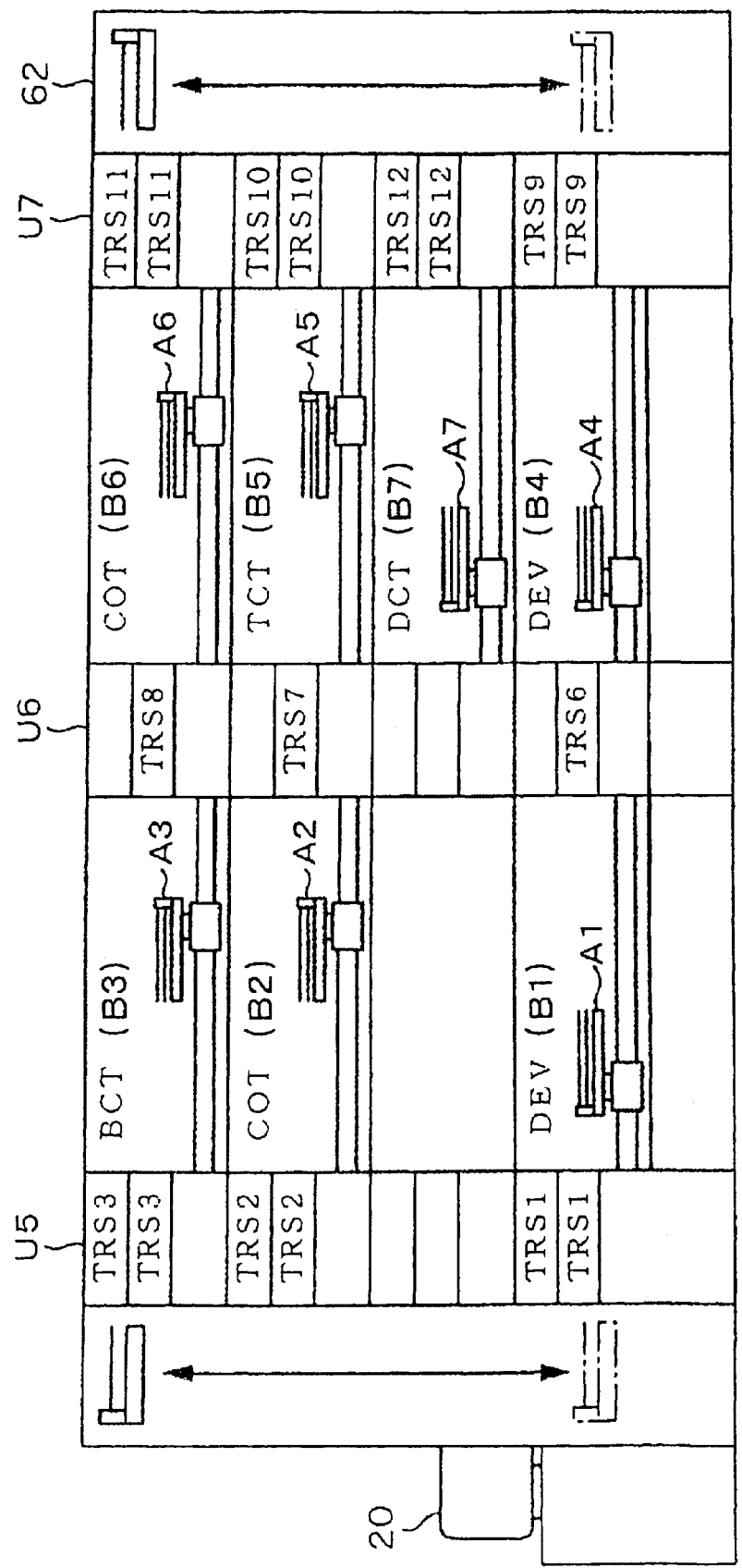
FIG. 7 is a schematic longitudinal cross-sectional view of a coating and developing apparatus in a second embodiment of the present invention.

FIG. 7 shows an essential part of a coating and developing apparatus in a second embodiment of the present invention. In the second embodiment, the exposure apparatus S4 connected to the coating and developing apparatus is an immersion exposure apparatus that exposes a wafer W while a liquid film is formed on the surface of the wafer. Corresponding thereto, the coating and developing apparatus is further includes a unit block (DCT layer) B7 having a water-shedding protective film coating unit, or a liquid processing unit, that forms a water-shedding protective film on a wafer W before exposure. The DCT layer B7 is disposed in one of the first and second unit-block stacks 41 and 42 (in the illustrated embodiment, the second unit-block stack 42). The water-shedding protective film prevents the liquid from penetrating through the resist film during the immersion exposure process. The unit block B7 may be provided with a cleaning unit for removing the protective film after exposure, for removing particles adhered to the wafer W before or after exposure, and for removing components adversely affecting the exposure process.

In the second embodiment, a wafer W removed from the transfer stage TRS10 or TRS11 of the unit stack U7 is transferred by the interface arm 62 (or the transfer arm 61) to the transfer stage TRS12, then is transferred to the main arm A7 of the DCT layer B7, and then a water-shedding protective film is formed on the wafer W in the DCT layer B7. Thereafter, the wafer W is transferred to the interface arm 62 through the transfer stage TRS12, and then is transferred to the exposure apparatus S4.

Figure 8:
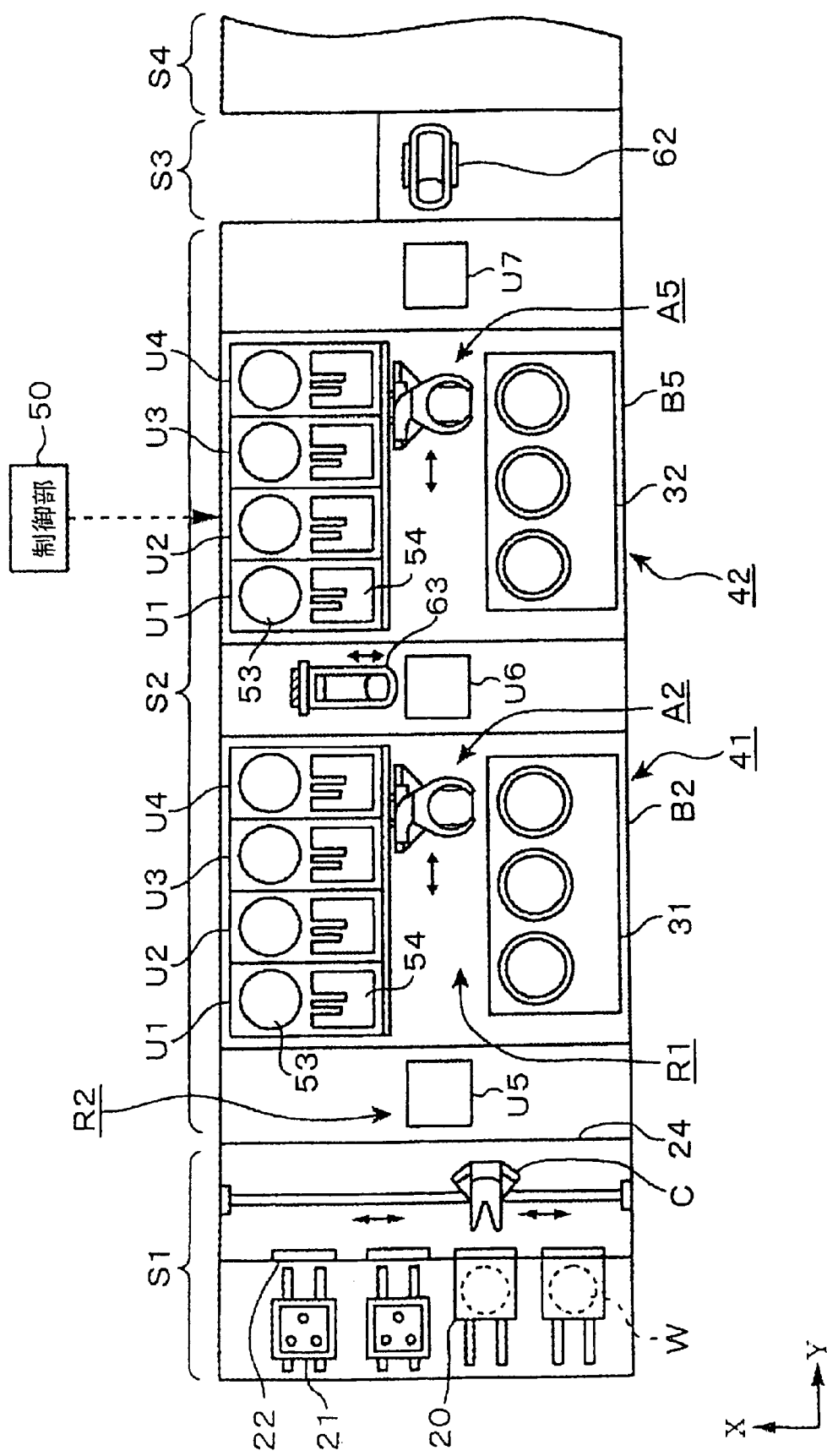
FIG. 8 is a schematic top plan view of a coating and developing apparatus in a third embodiment of the present invention.
Figure 9:
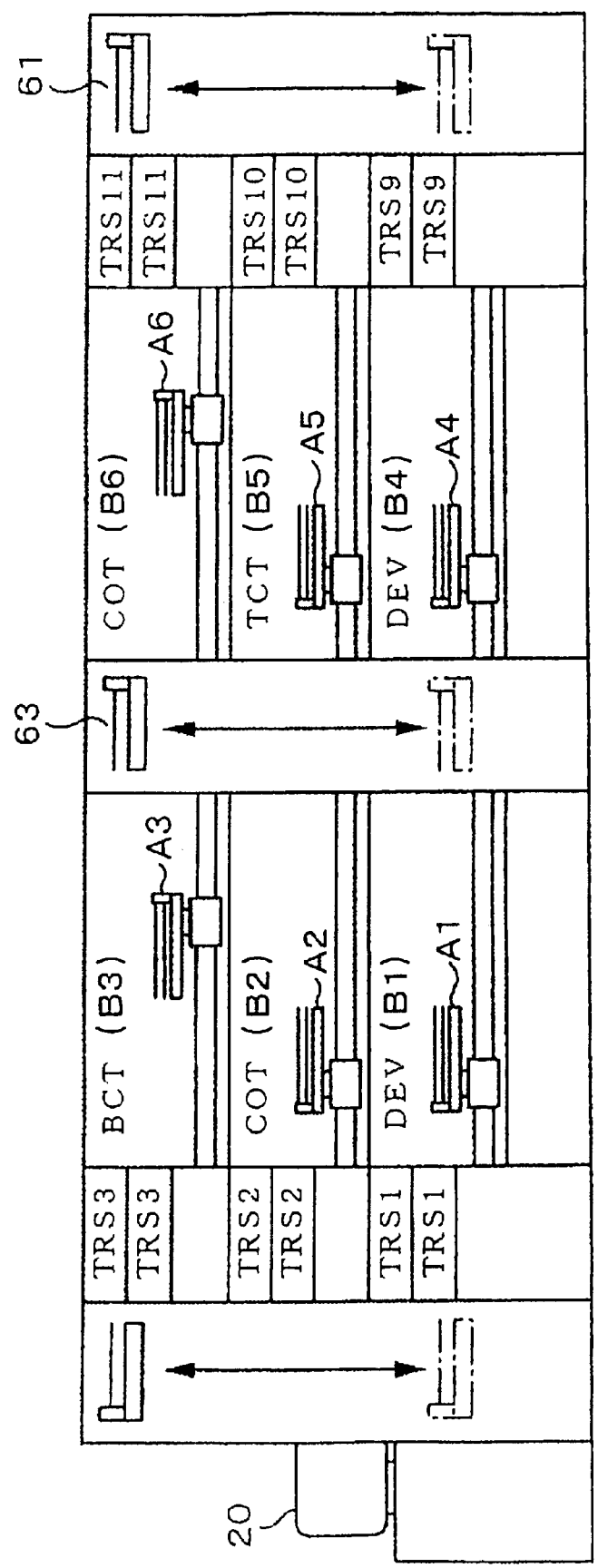
FIG. 9 is a schematic longitudinal cross-sectional view of the coating and developing apparatus shown in FIG. 8.

FIGS. 8 and 9 show an essential part of a coating and developing apparatus in a third embodiment of the present invention. In the third embodiment, a transfer arm 63 is arranged adjacent to the unit stack U6 between the first unit-block stack 41 and the second unit-block stack 42; and the transfer arm 62 arranged adjacent to the unit stack U7 in the first embodiment is replaced with the transfer arm 63 having the same task as that of the transfer arm 62. The transfer arm 63 is configured to move vertically between a level corresponding to the uppermost unit blocks of the first and the second unit-block stacks 41 and 42 and a level corresponding to the lowermost unit blocks of the first and the second unit-block stacks 41 and 42. In the third embodiment, intermediate stages in the unit stack U6 are used to transfer a wafer W between unit blocks in the second unit-block stack 42 (e.g., between the COT layer B6 and TCT layer B5) by using the transfer arm 63. To this end, the unit stack U6 includes: two intermediate stages TRS6 stacked up and arranged between the unit blocks B1 and B4; two intermediate stages TRS7 stacked up and arranged between the unit blocks B2 and B5; and two intermediate stages TRS8 stacked up and arranged between the unit blocks B3 and B6. Note that, in FIG. 9, the intermediate stages overlap the transfer arm 63, and are not shown for the simplicity of the drawing.

Figure 10:
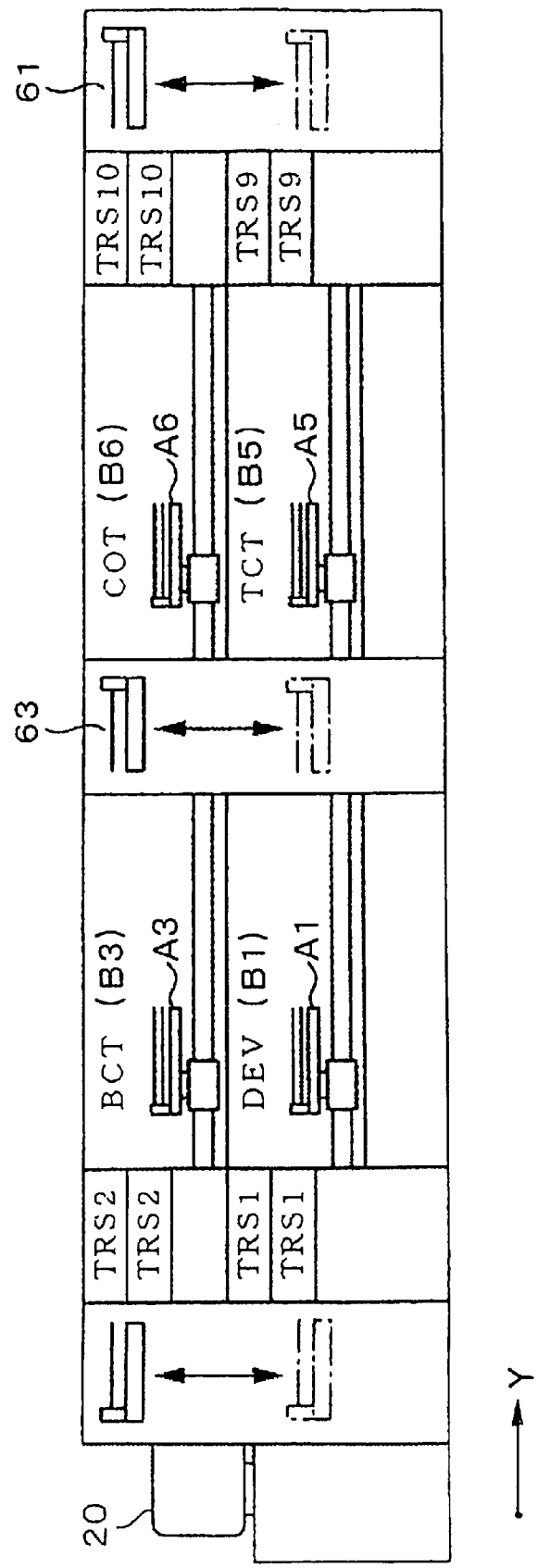
FIG. 10 is a schematic longitudinal cross-sectional view of a coating and developing apparatus in a fourth embodiment of the present invention.
Figure 11:
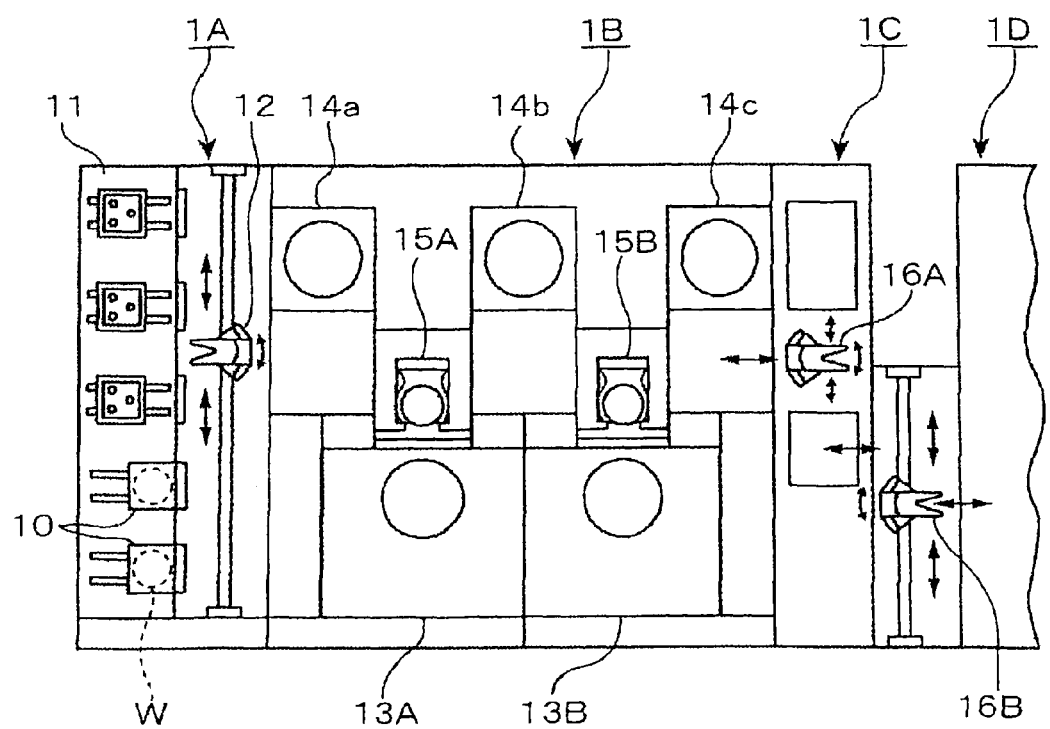
FIG. 11 is a schematic top plan view of a conventional coating and developing apparatus.

FIG. 10 shows an essential part of a coating and developing apparatus in a fourth embodiment of the present invention. In this embodiment, the first unit-block stack 41 comprises a stack of a DEV layer B1 and a BCT layer B3, and the second unit-block stack 42 comprises a stack of a TCT layer B5 and a COT layer B6.

In the foregoing embodiments, the lowermost unit blocks of the first and second unit-block stacks 41 and 42 are DEV layers, but are not limited thereto. The lowermost unit block of the second unit-block stack 42 may be a unit block for inspection. If the exposure apparatus S4 is an immersion exposure apparatus, a cleaning unit, or a liquid processing unit, for removing a water-shedding protective film after exposure, for removing particles adhered to the wafer W before or after exposure, and for removing components adversely affecting the exposure process may be provided in the lowermost unit block of the second unit-block stack 42.

If the aforementioned unit block is used as a unit block for inspection, the unit block is provided with inspection units for inspecting the wafer conditions and a main arm for transferring a wafer to and from each of the inspection units, in place of the heating unit and the cooling unit. Inspections to be made before exposure include an inspection of the coating film thickness and an inspection of impurities, for example. Inspections to be made after exposure include an inspection of overlay accuracy, for example. A unit provided in a unit block for inspection is not limited to an inspection unit, and may be an alignment-mark detection unit or a unit for removing a part of the film by a laser beam process.

Concrete examples of the inspection unit to be provided in the unit block for inspection are as follows:

a film thickness inspection unit for measuring the thickness of a film coated on a wafer W;

an uneven coating inspection unit for detecting uneven coating of a resist liquid;

a cleaning unit for clean a substrate before and/or after exposure;

a defocusing inspection unit for detecting the offset of the pattern occurred in the exposure apparatus;

a development defect inspection unit for detecting defects in the development process;

a comet inspection unit for detecting comets generated on the surface of a wafer W after coated with a resist liquid generated due to the existence of bubbles or impurities in the resist liquid;

a splash-back inspection unit for detecting splash-backs generated due to the re-attachment of a solvent of a resist liquid once thrown out from the wafer W surface;

a common defect inspection unit for detecting a common defect appearing at the same location on wafer W surfaces and having the same shape;

a scum inspection unit for detecting resist residue remaining on a wafer W after development;

a No-resist/No-development inspection unit (failure inspection unit) for detecting the failure in executing a resist coating process and/or a development process;

a line-width measurement unit for measuring the line width of a resist film formed on a wafer W; and an overlay accuracy inspection unit for inspecting the overlay accuracy between a wafer W exposed by an exposure apparatus and a photomask by comparing it with a reference value.

The unit block for inspection may be provided at least one of the above.

The coating and developing apparatus according to the present invention may be such that it performs coating and developing processes to a substrate other than a semiconductor wafer, such as a glass substrate (LCD substrate) for a liquid crystal display.

The invention claimed is:

1. A coating and developing apparatus comprising:
a carrier block, a process block, and an interface block connectable to an exposure apparatus, wherein the coating and developing apparatus is configured, upon connection of said coating and developing apparatus with the exposure apparatus, to perform operations including:
transferring a substrate carried into the carrier block by using a carrier to the process block;
coating the substrate with a coating film including a resist film in the process block;
sending the substrate to the exposure apparatus through the interface block;
developing the substrate, which has been exposed and returned to the process block through the interface block, in the process block; and then
transferring the substrate to the carrier block, wherein:
(a) the process block is provided with a plurality of unit blocks each including: a liquid processing unit that applies a chemical liquid onto a substrate; a heating unit that heats a substrate; a cooling unit that cools a substrate; and a conveyer for the unit block that transfers a substrate among those units, and wherein each of the unit blocks is provided therein with a conveying passage extending from a carrier-block side thereof to an interface-block side thereof;
(b) the process block is provided with a first unit-block stack formed by stacking a plurality of unit blocks and a second unit-block stack formed by stacking a plurality of unit blocks, wherein the first unit-block stack is disposed on a carrier-block side and the second unit-block stack is disposed on a interface-block side;
(c) intermediate stages are disposed between the first unit-block stack and the second unit-block stack such that each of the intermediate stages is disposed between unit blocks located on the same level to transfer a substrate therebetween;
(d) the first unit-block stack comprises: a unit block for bottom antireflective film formation including a liquid processing unit that applies a chemical liquid for forming a bottom antireflective film to a substrate before a resist liquid is applied to the substrate; a unit block for resist film formation including a liquid processing unit that applies a resist liquid to a substrate; and a unit block for development including a liquid processing unit that applies a developing liquid to an exposed substrate to develop the same;
(e) the second unit-block stack comprises: a unit block for resist film formation including a liquid processing unit that applies a resist liquid to a substrate; a unit block for top antireflective film formation including a liquid processing unit that applies a chemical liquid for forming a top antireflective film to a substrate after a resist liquid is applied to the substrate; and a unit block for development including a liquid processing unit that applies a developing unit to an exposed substrate to develop the same;
(f) the unit block for resist film formation of the second unit-block stack is located on the same level as that of the unit block for bottom antireflective film formation of the first unit-block stack; the unit block for top antireflective film formation of the second unit-block stack is located on the same level as that of the unit block for resist film formation of the first unit-block stack; and the unit block for development of the second unit-block stack is located on the same level as that of the unit block for development of the first unit-block stack;

(g) said coating and developing apparatus includes a controller that controls operations of said coating and developing apparatus to achieve processing modes including:

a first processing mode in which an antireflective film is formed on the substrate in the unit block for bottom antireflective film formation of the first unit-block stack; the substrate is transferred through an intermediate stage corresponding to said unit block for bottom antireflective film formation of the first unit-block stack to the unit block for resist film formation of the second unit-block stack; and in which unit block a resist film is formed on the substrate; and a second processing mode in which a resist film is formed on the substrate in the unit block for resist film formation of the first unit-block stack; the substrate is transferred through an intermediate stage corresponding to said unit block for resist film formation of the first unit-block stack to the unit block for top antireflective film formation of the second unit-block stack; and in which unit block an antireflective film is formed on the substrate.

2. The coating and developing apparatus according to claim 1, wherein one of the unit block for development of the first unit-block stack and the unit block for development of the second unit-block stack is replaced with a unit block for inspection including an inspecting unit for inspecting a surface of a substrate and a conveyer for the unit block for transferring a substrate between the inspecting unit and an intermediate stage.

3. The coating and developing apparatus according to claim 1, further comprising a vertically-movable transfer device for transferring a substrate between the unit block for resist film formation of the second unit-block stack and the unit block for top antireflective film formation of the second unit-block stack, wherein said apparatus has a third processing mode in which: an antireflective film is formed on the substrate in the unit block for bottom antireflective film formation of the first unit-block stack; the substrate is transferred through an intermediate stage corresponding to said unit block for bottom antireflective film formation of the first unit-block stack to the unit block for resist film formation of the second unit-block stack; in which unit block a resist film is formed on the substrate; from which unit block the substrate is transferred via the vertically-movable transfer device to the unit block for top antireflective film formation of the second unit-block stack; and in which unit block a top antireflective film is formed on the substrate.

4. The coating and developing apparatus according to claim 3, wherein one of the unit block for development of the first unit-block stack and the unit block for development of the second unit-block stack is replaced with a unit block for inspection including an inspecting unit for inspecting a surface of a substrate and a conveyer for the unit block for transferring a substrate between the inspecting unit and an intermediate stage.

5. The coating and developing apparatus according to claim 1, further comprising a vertically-movable transfer device for transferring a substrate between the unit block for bottom antireflective film formation of the first unit-block stack and the unit block for resist film formation of the first unit-block stack, wherein said apparatus has a fourth processing mode in which: an antireflective film is formed on the substrate in the unit block for bottom antireflective film formation of the first unit-block stack; from which unit block the substrate is transferred via the vertically-movable transfer device to the unit block for resist film formation of the first unit-block stack; in which unit block a resist film is formed on the substrate; the substrate is transferred through an intermediate stage corresponding to said unit block for resist film formation to the unit block for top antireflective film formation of the second unit-block stack; and in which unit block stack a top antireflective film is formed on the substrate.

6. The coating and developing apparatus according to claim 5, wherein one of the unit block for development of the first unit-block stack and the unit block for development of the second unit-block stack is replaced with a unit block for inspection including an inspecting unit for inspecting a surface of a substrate and a conveyer for the unit block for transferring a substrate between the inspecting unit and an intermediate stage.

* * * * *